(12) United States Patent
Lu et al.

(10) Patent No.: US 12,106,945 B2
(45) Date of Patent: Oct. 1, 2024

(54) PLASMA PROCESSING APPARATUS AND METHOD OF MANUFACTURING SEMICONDUCTOR DEVICE USING THE SAME

(71) Applicant: Samsung Electronics Co., Ltd., Suwon-si (KR)

(72) Inventors: Siqing Lu, Seongnam-si (KR); Cheonkyu Lee, Hwaseong-si (KR); Takafumi Noguchi, Yokohama (JP)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 289 days.

(21) Appl. No.: 17/528,321

(22) Filed: Nov. 17, 2021

(65) Prior Publication Data
US 2022/0076931 A1    Mar. 10, 2022

Related U.S. Application Data

(63) Continuation of application No. 16/454,105, filed on Jun. 27, 2019, now abandoned.

(30) Foreign Application Priority Data

Dec. 4, 2018    (KR) .................. 10-2018-0154689

(51) Int. Cl.
*H01J 37/32*    (2006.01)
*C23C 14/54*    (2006.01)
(Continued)

(52) U.S. Cl.
CPC ...... *H01J 37/32724* (2013.01); *C23C 14/541* (2013.01); *C23C 16/4586* (2013.01);
(Continued)

(58) Field of Classification Search
CPC ......... H01J 37/32724; H01J 2237/2065; H01J 2237/3344; H01J 37/32091; H01J 37/321;
(Continued)

(56) References Cited

U.S. PATENT DOCUMENTS 5,901,783 A    5/1999    Dobak, III et al.
7,771,564 B2   8/2010    Yokogawa et al.
(Continued)

FOREIGN PATENT DOCUMENTS

CN    10-5047527 A    11/2015
JP    2005-101505 A    4/2005
(Continued)

OTHER PUBLICATIONS

Office Action dated Apr. 30, 2024 for corresponding application No. CN 201910864306.4.

*Primary Examiner* — Duy Vu N Deo
*Assistant Examiner* — Christopher Remavege
(74) *Attorney, Agent, or Firm* — Muir Patent Law, PLLC

(57) ABSTRACT

A plasma processing apparatus includes a process chamber, a substrate support chuck configured to support a substrate in the process chamber, the substrate support chuck including an upper cooling channel and a lower cooling channel that are symmetrically separated from each other, and a support chuck temperature controller configured to supply a first coolant to the upper cooling channel and to supply a second coolant to the lower cooling channel.

20 Claims, 16 Drawing Sheets

(51) Int. Cl.
  *C23C 16/458* (2006.01)
  *C23C 16/46* (2006.01)
  *H01L 21/67* (2006.01)

(52) U.S. Cl.
  CPC ...... *C23C 16/463* (2013.01); *H01L 21/67248* (2013.01); *H01J 2237/2065* (2013.01); *H01J 2237/3344* (2013.01)

(58) Field of Classification Search
  CPC ........ H01J 2237/3323; H01J 2237/334; C23C 14/541; C23C 16/4586; C23C 16/463; H01L 21/67248; H01L 21/67109; H01L 21/683
  See application file for complete search history.

(56) References Cited

U.S. PATENT DOCUMENTS

| | | | |
|---|---|---|---|
| 9,508,578 | B2 | 11/2016 | Adderly et al. |
| 9,681,497 | B2 | 6/2017 | Nangoy et al. |
| 2002/0088608 | A1 | 7/2002 | Park |
| 2004/0040664 | A1 | 3/2004 | Yang et al. |
| 2004/0097088 | A1 | 5/2004 | Kitayama et al. |
| 2004/0187791 | A1 | 9/2004 | Busse et al. |
| 2005/0018376 | A1 | 1/2005 | Park et al. |
| 2005/0155373 | A1 | 7/2005 | Hiraoka et al. |
| 2006/0285270 | A1 | 12/2006 | Lee |
| 2009/0250202 | A1 | 10/2009 | Eibl |
| 2010/0177454 | A1 | 7/2010 | Elliot |
| 2012/0038120 | A1 | 2/2012 | Bartlett et al. |
| 2013/0109190 | A1 | 5/2013 | Lill et al. |
| 2013/0112383 | A1* | 5/2013 | Hanamachi ............. C23C 24/04 165/170 |
| 2014/0004706 | A1 | 1/2014 | Miya et al. |
| 2014/0008020 | A1 | 1/2014 | Nagayama |
| 2014/0096716 | A1 | 4/2014 | Chung et al. |
| 2015/0318146 | A1 | 11/2015 | Kim |
| 2016/0358761 | A1 | 12/2016 | Atlas et al. |
| 2017/0358460 | A1* | 12/2017 | Tomura ............. H01L 21/31144 |
| 2018/0142352 | A1 | 5/2018 | Shah et al. |
| 2018/0218886 | A1 | 8/2018 | Yamaguchi et al. |
| 2019/0057851 | A1* | 2/2019 | Bhat .................... B23K 15/006 |

FOREIGN PATENT DOCUMENTS

| | | |
|---|---|---|
| JP | 3729722 B2 | 12/2005 |
| JP | 2009512224 A | 3/2009 |
| JP | 2011205000 A | 10/2011 |
| KR | 10-2000-0026856 A | 5/2000 |
| KR | 1020180090204 A | 8/2018 |

\* cited by examiner

PLASMA PROCESSING APPARATUS AND METHOD OF MANUFACTURING SEMICONDUCTOR DEVICE USING THE SAME

CROSS-REFERENCE TO RELATED APPLICATION

This application is a continuation application of U.S. patent application Ser. No. 16/454,105, filed Jun. 27, 2019, which claims priority to Korean Patent Application No. 10-2018-0154689, filed on Dec. 4, 2018, in the Korean Intellectual Property Office, the disclosure of each of which is incorporated herein in its entirety by reference.

BACKGROUND

The inventive concept relates to a semiconductor manufacturing apparatus, and more particularly, to a plasma processing apparatus. The disclosure also relates to a method of manufacturing a semiconductor device using the semiconductor manufacturing apparatus.

Generally, a series of processes such as deposition, etching, and cleaning may be performed to manufacture a semiconductor device. Such a process may be made by a deposition, etching or cleaning apparatus provided with a process chamber. For example, in the case of an etching process using a plasma processing technique, a plasma etching apparatus for etching a material film on a substrate using a plasma such as a capacitively coupled plasma or an inductively coupled plasma is widely used. In such a plasma processing process, the temperature of a wafer, which affects the uniformity of the plasma processing process, is desired to be precisely controlled.

SUMMARY

The inventive concept provides a plasma processing apparatus capable of improving the uniformity of a plasma processing process.

According to an aspect of the inventive concept, there is provided a plasma processing apparatus including a process chamber, a substrate support chuck configured to support a substrate in the process chamber, the substrate support chuck comprising an upper cooling channel and a lower cooling channel that are symmetrically separated from each other, and a support chuck temperature controller configured to supply a first coolant to the upper cooling channel and to supply a second coolant to the lower cooling channel.

According to another aspect of the inventive concept, there is provided a plasma processing apparatus including a process chamber, a substrate support chuck configured to support a substrate in the process chamber, the substrate support chuck comprising an upper cooling channel and a lower cooling channel symmetrical to each other with respect to a plane horizontally traversing to the substrate support chuck, and a support chuck temperature controller configured to supply a first coolant to the upper cooling channel and to supply a second coolant to the lower cooling channel and configured to determine a flow direction of the first coolant and a flow direction of the second coolant.

According to another aspect of the inventive concept, there is provided a plasma processing apparatus including a process chamber, and a substrate support chuck configured to support a substrate in the process chamber, the substrate support chuck comprising a cooling channel configured to flow a coolant and a fin protruding from an inner wall of the cooling channel.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
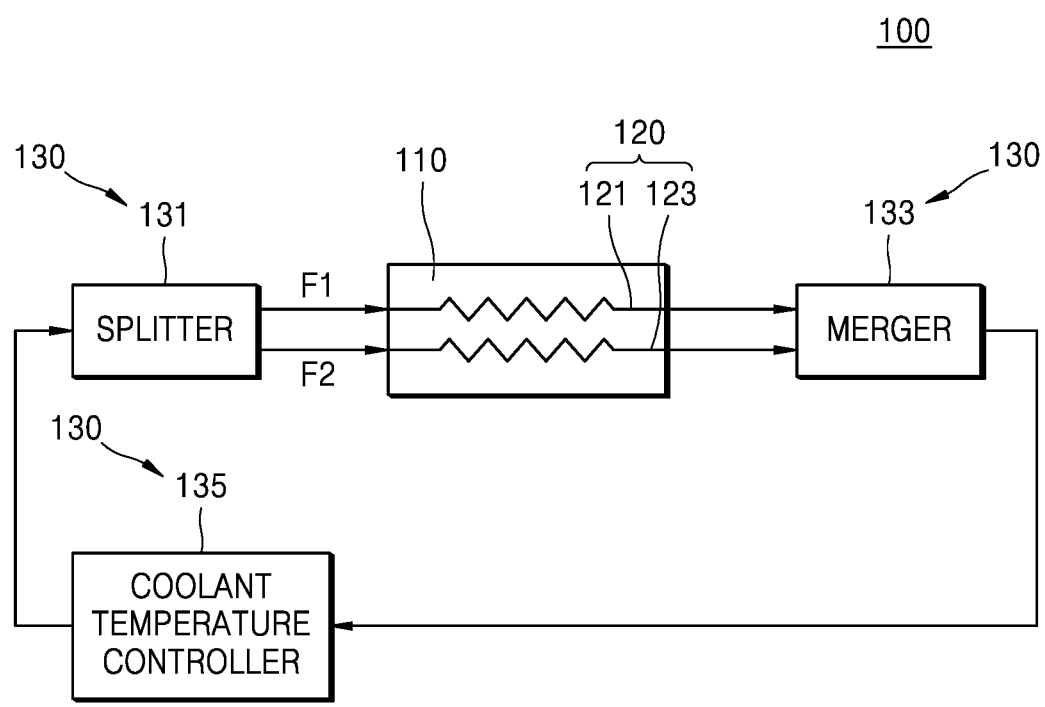
FIG. 1 is a block diagram schematically showing a plasma processing apparatus according to an embodiment.

Hereinafter, embodiments of the technical idea of the inventive concept will be described in detail with reference to the accompanying drawings. The same reference numerals are used for the same constituent elements in the drawings, and a duplicate description thereof may be omitted.

FIG. 1 is a block diagram showing a plasma processing apparatus 100 according to example embodiments of the inventive concept.

Referring to FIG. 1, the plasma processing apparatus 100 may include a substrate support chuck 110 and a support chuck temperature controller 130.

The substrate support chuck 110 may support a substrate such as a wafer during a plasma processing process. The substrate support chuck 110 may include a cooling channel 120 through which a coolant may flow. The cooling channel 120 may have, for example, a concentrical or spiral shape about a central axis of the substrate support chuck 110.

The cooling channel 120 of the substrate support chuck 110 may include an upper cooling channel 121 and a lower cooling channel 123. The upper cooling channel 121 and the lower cooling channel 123 may be separated from each other.

In some embodiment, the upper cooling channel 121 and the lower cooling channel 123 may be symmetrical to each other. For example, the upper cooling channel 121 and the lower cooling channel 123 may have a mirror image shape with respect to a plane disposed between the upper cooling channel 121 and the lower cooling channel 123 across the substrate support chuck 110.

The support chuck temperature controller 130 may supply a first coolant F1 to the upper cooling channel 121 and may supply a second coolant F2 to the lower cooling channel 123. The support chuck temperature controller 130 may adjust a temperature profile of the substrate support chuck 110 and a temperature profile of a substrate mounted on the substrate support chuck 110 by adjusting a flow rate, flow direction and/or temperature of each of the first coolant F1 and the second coolant F2.

For example, the substrate support chuck 110 may be provided in a process chamber for performing a plasma processing process, and may function as an electrode for plasma generation. When a wafer is exposed to the plasma generated in the process chamber, a high thermal load may be generated due to ion bombardment applied to the wafer. Since such a thermal load causes an irregular plasma processing process, it is beneficial to supply the coolant to the upper cooling channel 121 and the lower cooling channel 123 to remove the thermal load of the wafer.

Here, the coolant may comprise a material operable over a wide temperature range. For example, the coolant may comprise water, ethylene glycol, silicone oil, liquid Teflon, or a mixture thereof. For example, the support chuck temperature controller 130 may supply a coolant of a cryogenic temperature range, for example, a temperature range between −20° C. and −120° C., or a temperature between −50° C. and −100° C., to the substrate support chuck 110, or may supply a coolant at room temperature to the substrate support chuck 110. As the coolant flows along the upper cooling channel 121 and the lower cooling channel 123, the temperature of the substrate support chuck 110 may increase or decrease.

The support chuck temperature controller 130 may include a splitter 131, a merger 133, and a coolant temperature controller 135.

The splitter 131 may adjust a flow rate of the first coolant F1 supplied to the upper cooling channel 121 and a flow rate of the second coolant F2 supplied to the lower cooling channel 123. For example, the splitter 131 may adjust the flow rates of the first and second coolants F1 and F2 with respect to each other, e.g., by adjusting the ratio of the first coolant F1 to the second coolant F2. In certain embodiments, the splitter 131 may individually adjust the flow rates of the first and second coolants F1 and F2, e.g., independently from each other, e.g., by using one or more devices adjusting respective amounts and/or pressures of the first and second coolants F1 and F2.

For example, the splitter 131 may separate the coolant introduced into the splitter 131 to supply the first coolant F1 to the upper cooling channel 121 and supply the second coolant F2 to the lower cooling channel 123. For example, the splitter 131 may separate the coolant introduced into the splitter 131 at the same ratio to make a flow rate of the first coolant F1 equal to a flow rate of the second coolant F2. Alternatively, the splitter 131 may separate the coolant introduced into the splitter 131 at different ratios so that the flow rate of the first coolant F1 and the flow rate of the second coolant F2 may be different from each other. For example, the splitter 131 may control the flow rates of the first and second coolants F1 and F2 on the basis of the temperatures of the first and second coolants F1 and F2. For example, the support chuck temperature controller 130 may comprise one or more thermometers. For example, the support chuck temperature controller 130 may include a thermometer detecting the temperature of each of the first and second coolants F1 and F2. For example, the support chuck temperature controller 130 may control temperatures of the first and second coolants F1 and F2 to be the same or to be different from each other. For example, the support chuck temperature controller 130 may control the splitter 131 to raise the flow rate of one of the first and second coolants F1 and F2 when the temperature of the one is higher than the other.

The first coolant F1 and the second coolant F2 that flow out of the substrate support chuck 110 are combined at the merger 133, and the coolant temperature controller 135 may adjust the temperature of the combined coolant. The coolant temperature controller 135 may include a heater configured to heat the coolant such that the temperature of the coolant increases and a chiller/cooler configured to cool the coolant such that the temperature of the coolant decreases. For example, the support chuck temperature controller 130 and/or the coolant temperature controller 135 may be a computer (or several interconnected computers) command including, for example, one or more processors configured by software, such as a CPU (Central Processing Unit), GPU (graphics processor), controller, etc., forming various functional modules of the computer. The computer may be a general purpose computer or may be dedicated hardware or firmware (e.g., an electronic circuit, such as application-specific hardware, such as, for example, a digital signal processor (DSP) or a field-programmable gate array (FPGA)). A computer may be configured from several interconnected computers. Connections and interactions between the units described herein may be hardwired and/or in the form of data (e.g., as data stored in and retrieved from memory of the computer, such as a register, buffer, cache, storage drive, etc., such as part of an application programming interface (API)).

Figure 2:
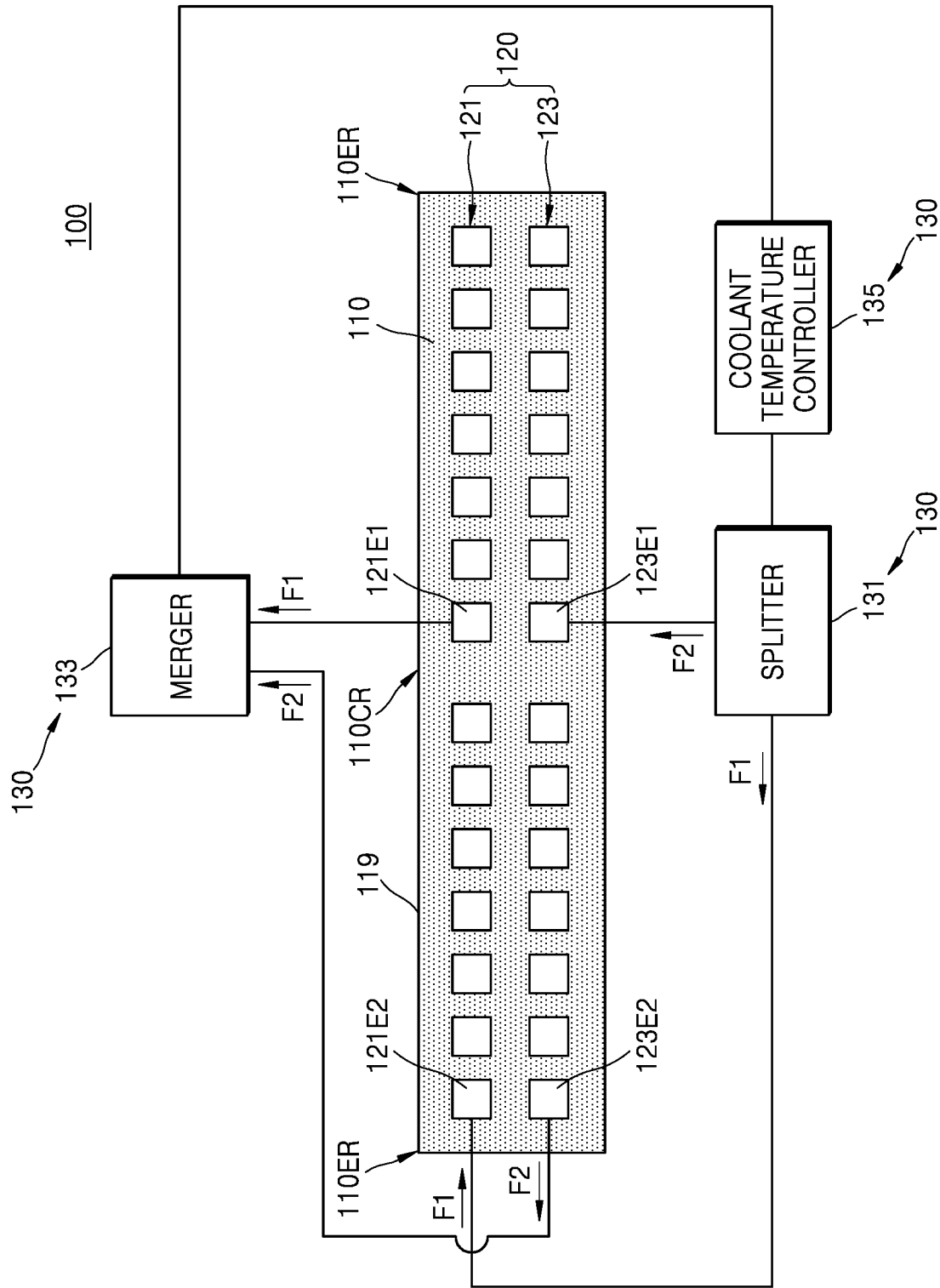
FIG. 2 is a block diagram of a plasma processing apparatus according to example embodiments of the inventive concept, in which a cross-section of a substrate support chuck is schematically illustrated to explain a method of adjusting the temperature of a substrate support chuck according to example embodiments of the inventive concept.
Figure 3:
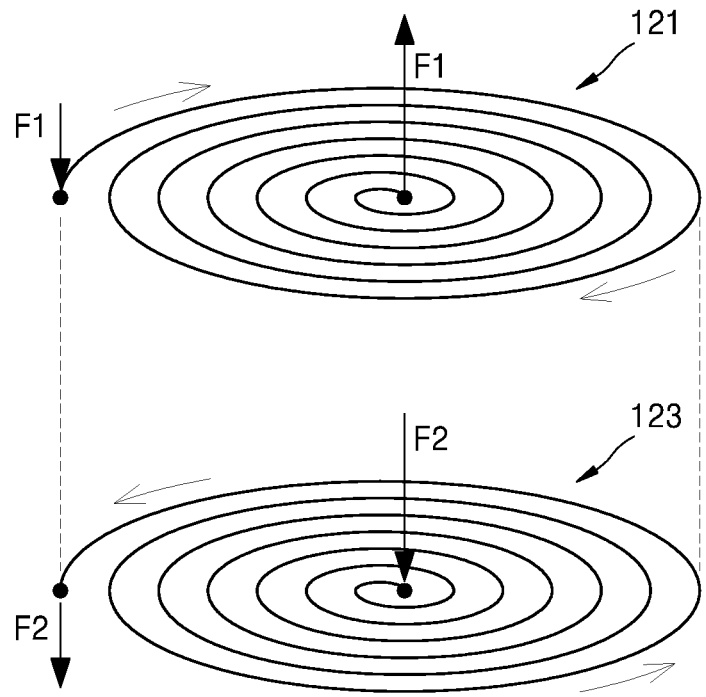
FIG. 3 is a perspective view showing a flow direction of a first coolant in an upper cooling channel and a flow direction of a second coolant in a lower cooling channel of FIG. 2.
Figure 4:
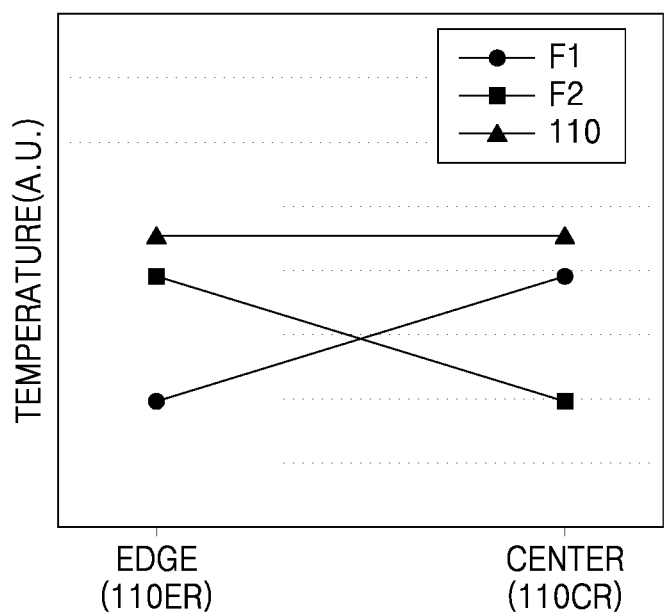
FIG. 4 is a graph showing a temperature change of the first coolant, a temperature change of the second coolant, and a temperature change of the substrate support chuck between a center and an edge of the substrate support chuck of FIG. 2.

FIG. 2 is a block diagram of the plasma processing apparatus 100 according to example embodiments of the inventive concept, in which one cross-section of the substrate support chuck 110 according to example embodiments of the inventive concept is schematically illustrated to explain a method of adjusting the temperature of a substrate support chuck 110 according to example embodiments of the inventive concept. FIG. 3 is a perspective view showing a flow direction of the first coolant F1 in the upper cooling channel 121 and a flow direction of the second coolant F2 in the lower cooling channel 123 of FIG. 2. FIG. 4 is a graph showing a temperature change of the first coolant F1, a temperature change of the second coolant F2, and a temperature change of the substrate support chuck of FIG. 2 between a center 110CR and an edge 110ER of the substrate support chuck 110.

Referring to FIGS. 2 and 3, the cooling channel 120 of the substrate support chuck 110 may include the upper cooling channel 121 and the lower cooling channel 123. The upper cooling channel 121 may be more adjacent to the mounting surface 119 of the substrate support chuck 110, on which the substrate is mounted, than the lower cooling channel 123. The upper cooling channel 121 and the lower cooling channel 123 may be separated from each other. For example, the upper cooling channel 121 and the lower cooling channel 123 may not be connected to an open area within the substrate support chuck 110 so that the first and second coolant F1 and F2 is not mixed within the substrate support chuck 110.

Each of the upper cooling channel 121 and the lower cooling channel 123 may extend in a spiral direction from the center 110CR of the substrate support chuck 110 toward the edge 110ER of the substrate support chuck 110. For example, each of the upper cooling channel 121 and the lower cooling channel 123 may extend in a spiral direction about a central axis passing through the center 110CR of the substrate support chuck 110 on a two-dimensional plane. For example, each of the upper and lower cooling channels 121 and 123 may extend spirally about an axis passing through the center 110CR of the substrate support chuck 110 in a perpendicular direction with respect to the top and/or bottom surface of the substrate support chuck 110.

For example, the upper cooling channel 121 may continuously/spirally extend from a first end 121E1 adjacent to the center 110CR of the substrate support chuck 110 to a second end 121E2 adjacent to the edge 110ER of the substrate support chuck 110, and the lower cooling channel 123 may continuously/spirally extend from a third end 123E1 adjacent to the center 110CR of the substrate support chuck 110 to a fourth end 123E2 adjacent to the edge 110ER of the substrate support chuck 110.

The support chuck temperature controller 130 may selectively introduce the first coolant F1 into one of the first end 121E1 and the second end 121E2 of the upper cooling channel 121 to adjust/determine a flow direction of the first coolant F1. Similarly, the support chuck temperature controller 130 may selectively introduce the second coolant F2 into one of the third end 123E1 and the fourth end 123E2 of the lower cooling channel 123 to adjust/determine a flow direction of the second coolant F2.

In example embodiments, the support chuck temperature controller 130 may allow the first coolant F1 flowing along the upper cooling channel 121 and the second coolant F2 flowing along the lower cooling channel 123 to flow in directions opposite to each other.

For example, the support chuck temperature controller 130 may introduce the first coolant F1 into the second end 121E2 of the upper cooling channel 121 to flow the first coolant F1 in a direction from the second end 121E2 of the upper cooling channel 121 toward the first end 121E1 thereof. In this case, the second end 121E2 of the upper cooling channel 121 is an inlet through which the first coolant F1 is introduced to the upper cooling channel 121, and the first end 121E1 of the upper cooling channel 121 may be an outlet through which the first coolant F1 flows out. For example, the first coolant F1 may be introduced into the upper cooling channel 121 through a portion in the vicinity of the edge 110ER of the substrate support chuck 110 and may flow through the upper cooling channel 121 to the vicinity of the center 110CR of the substrate support chuck 110 while being guided by the upper cooling channel 121, and thus may flow out of the substrate support chuck 110 through a portion near the center 110CR of the substrate support chuck 110.

At the same time, the support chuck temperature controller 130 may allow the second coolant F2 to flow into the third end 123E1 of the lower cooling channel 123. For example, the support chuck temperature controller 130 may allow the second coolant F2 to flow from the third end 123E1 of the lower cooling channel 123 in a direction toward the fourth end 123E2 of the cooling channel 123. In this case, the third end 123E1 of the lower cooling channel 123 may be an inlet through which the second coolant F2 flows into the lower cooling channel 123, and the fourth end 123E2 of the lower cooling channel 123 may be an outlet through which the second coolant F2 flows out. For example, unlike a flow path of the first coolant F1, when the second coolant F2 flows into the lower cooling channel 123 through a portion in the vicinity of the center 110CR of the substrate support chuck 110 and flows through the lower cooling channel 123 to the vicinity of the edge 110ER of the substrate support chuck 110 while being guided by the lower cooling channel 123, the second coolant F2 may flow out of the substrate support chuck 110 through a portion in the vicinity of the edge 110ER of the substrate support chuck 110.

The temperature of the coolant may vary during the flow from the inlet to the outlet of the cooling channel 120, and a temperature difference may occur between the inlet temperature of the coolant at the inlet of the cooling channel 120 and the outlet temperature of the coolant at the outlet of the cooling channel 120. When a single cooling channel extends in a spiral direction, the temperature difference between the inlet temperature of the coolant and the outlet temperature of the coolant may cause a temperature non-uniformity between the center 110CR of the substrate support chuck 110 and the edge 110ER of the substrate support chuck 110.

However, according to example embodiments of the inventive concept, the temperature of the substrate support chuck 110 may be more uniformly controlled by flowing the first coolant F1 and the second coolant F2 in opposite directions to each other. For example, as illustrated in FIG. 4, since the first coolant F1 exchanges heat with the substrate support chuck 110 while flowing along the upper cooling channel 121, the temperature of the first coolant F1 may increase as the the first coolant F1 approaches toward the center 110CR of the substrate support chuck 110. Similarly, since the second coolant F2 exchanges heat with the substrate support chuck 110 while the second coolant F2 flows along the lower cooling channel 123, the temperature of the second coolant F2 may increase as the second coolant F2 approaches the edge 110ER of the substrate support chuck 110. In this case, when the flow rate of the first coolant F1 is equal to the flow rate of the second coolant F2, the temperature of the second coolant F2 may decrease as the temperature of the first coolant F1 increases in the direction from the center 110CR to the edge 110ER of the substrate support chuck 110, and the temperature of the substrate support chuck 110 between the center 110CR of the substrate support chuck 110 and the edge 110ER of the substrate support chuck 110 may be uniform as a whole.

In certain embodiments, the substrate support chuck 110 may be used in a plasma etching apparatus configured to perform a cryogenic etch on a substrate under high radio frequency (RF) power conditions to perform an etching process with high aspect ratio characteristics. The cryogenic etching may be carried out at a cryogenic temperature range, for example, a temperature range between −20° C. and −120° C., or within a temperature range between −50° C. and −100° C. In the cryogenic etching process, an etching profile may be adjusted according to the temperature of the substrate. For example, a better anisotropic etching profile may obtained in a cryogenic etching process than a traditional plasma etching process, and the etching process obtaining high aspect ratio characteristics may be performed by appropriately adjusting the temperature of the substrate support chuck 110. The viscosity of the coolant may be greatly increased at a cryogenic temperature condition. Even though the coolant is introduced into the cooling channel 120 at a relatively high flow rate, the flow of the coolant may be converted from turbulent flow to laminar flow. In this case, the heat transfer between the substrate support chuck 110 and the coolant flowing into the laminar flow may be reduced, and the thermal load applied to the substrate support chuck 110 may not be effectively removed.

However, according to the example embodiments of the inventive concept, the upper cooling channel 121 and the lower cooling channel 123 may have a relatively small spiral shape in the bent portion, and the pressure loss of the first coolant F1 during the flow from the inlet to the outlet of the upper cooling channel 121 and the pressure loss of the second coolant F2 during the flow from the inlet to the outlet of the lower cooling channel 123 may be minimized. For example, even in the cryogenic temperature range, the heat load of the substrate support chuck 110 may be more effectively removed by the structure of the disclosed embodiments. For example, two layers of cooling channels including the upper and lower cooling channels 121 and 123 may be beneficial to alleviate the pressure loss of the coolants in the cooling channels of the substrate support chuck 110.

Figure 5:
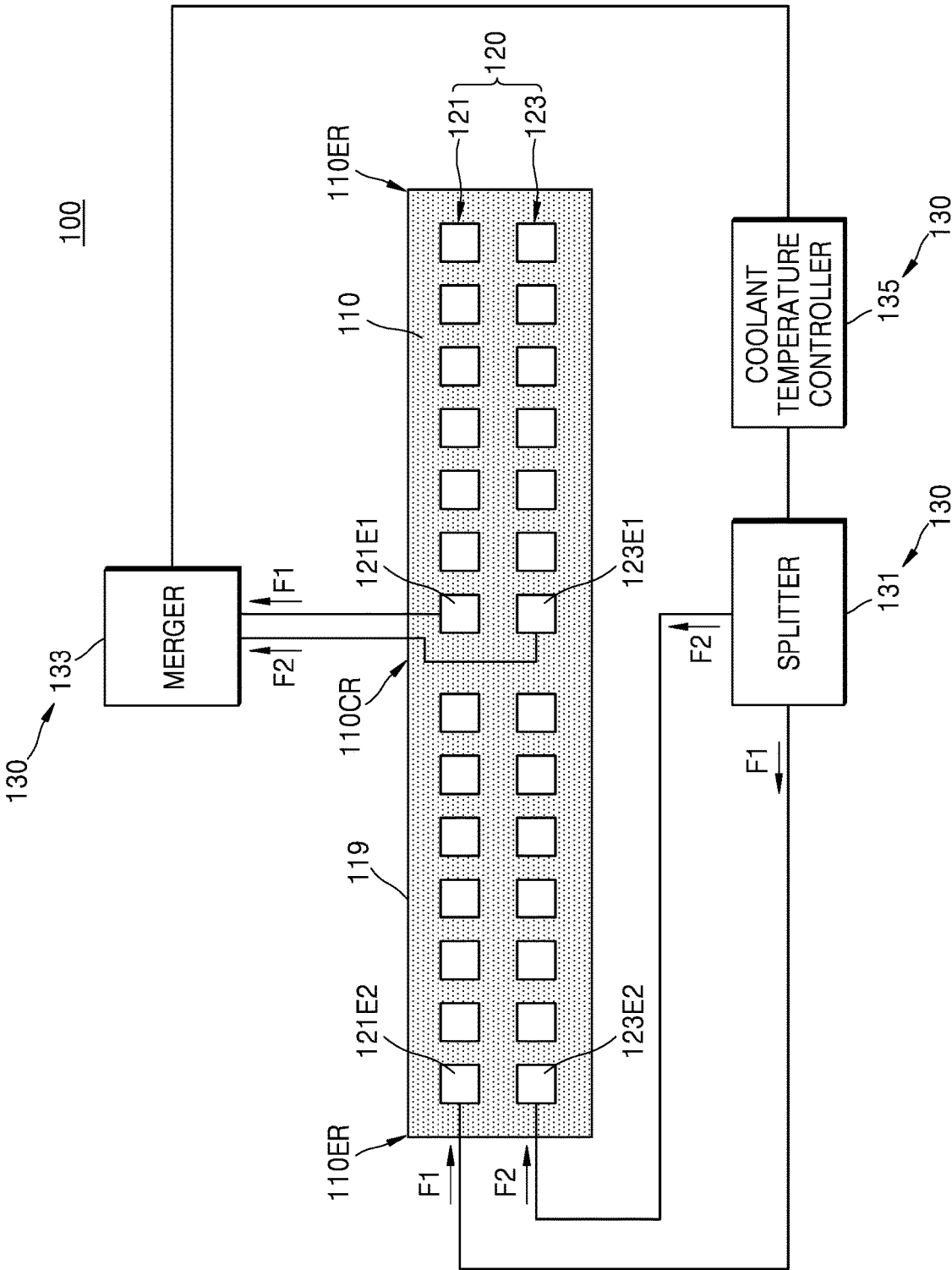
FIG. 5 is a schematic diagram of a plasma processing apparatus according to example embodiments of the inventive concept, in which a cross-section of a substrate support chuck is schematically illustrated to explain a method of adjusting the temperature of a substrate support chuck according to example embodiments of the inventive concept.
Figure 6:
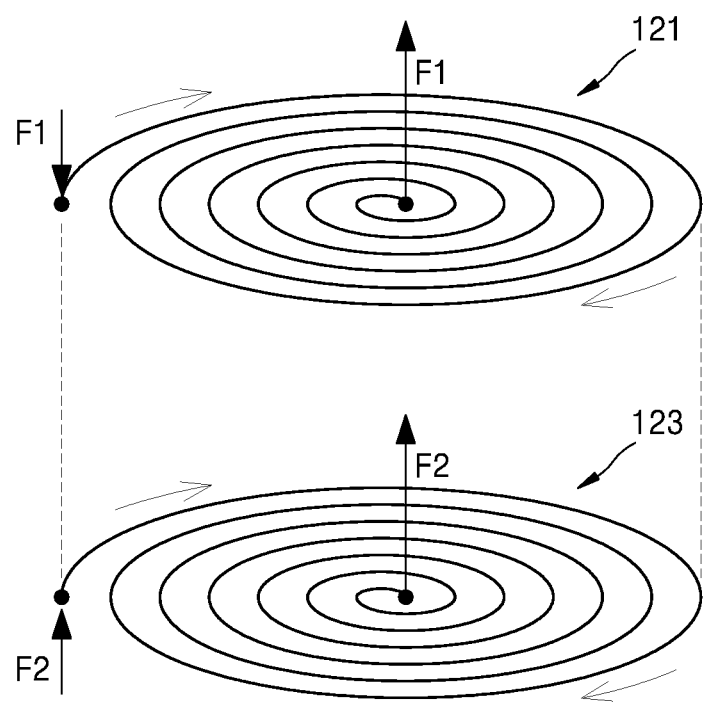
FIG. 6 is a perspective view showing a flow direction of a first coolant in the upper cooling channel and a flow direction of a second coolant in the lower cooling channel of FIG. 5.

FIG. 5 is a schematic diagram of the plasma processing apparatus 100 according to example embodiments of the inventive concept, in which a cross-section of a substrate support chuck 110 is schematically illustrated to explain a method of adjusting the temperature of a substrate support chuck according to example embodiments of the inventive concept. FIG. 6 is a diagram showing a flow direction of the first coolant F1 in the upper cooling channel 121 and a flow direction of the second coolant F2 in the lower cooling channel 123 in a perspective view.

Referring to FIGS. 5 and 6, the support chuck temperature controller 130 may flow the first coolant F1 along the upper cooling channel 121 and the second coolant F2 along the lower cooling channel 123 in the same direction.

For example, the support chuck temperature controller 130 may introduce the first coolant F1 into the second end 121E2 of the upper cooling channel 121 to flow the first coolant F1 in a direction from the second end 121E2 of the upper cooling channel 121 toward the first end 121E1 thereof. For example, the first coolant F1 may be introduced to the substrate support chuck 110 through a portion in the vicinity of the edge 110ER of the substrate support chuck 110 and may flow through the upper cooling channel 121 to the vicinity of the center 110CR of the substrate support chuck 110 while being guided by the upper cooling channel 121, and thus may flow out of the substrate support chuck 110 through a portion near the center 110CR of the substrate support chuck 110.

At the same time, the support chuck temperature controller 130 may flow the second coolant F2 from the fourth end 123E2 of the lower cooling channel 123 in a direction toward the third end 123E1 of the cooling channel 123 by introducing the second coolant F2 into the fourth end 123E2 of the lower cooling channel 123. For example, similar to the flow path of the first coolant F1, the second coolant F2 may flow into the substrate support chuck 110 through a portion in the vicinity of the edge 110ER of the substrate support chuck 110 and may be guided to the lower cooling channel 123, and thus may flow out of the substrate support chuck 110 through a portion in the vicinity of the center 110CR of the substrate support chuck 110.

In this case, the temperature of the first coolant F1 and the temperature of the second coolant F2 may increase as the first coolant F1 and the second coolant F2 approach the center 110CR of the substrate support chuck 110. Since the heat transfer from the substrate support chuck 110 to the first coolant F1 and the second coolant F2 in a region near the edge 110ER of the substrate support chuck 110 may be greater than a region near the center 110CR of the substrate support chuck 110, the temperature profile of the substrate support chuck 110 may be controlled such that the temperature in the vicinity of the center 110CR of the substrate support chuck 110 is relatively high and the temperature in the vicinity of the edge 110ER of the substrate support chuck 110 is relatively low.

Figure 7:
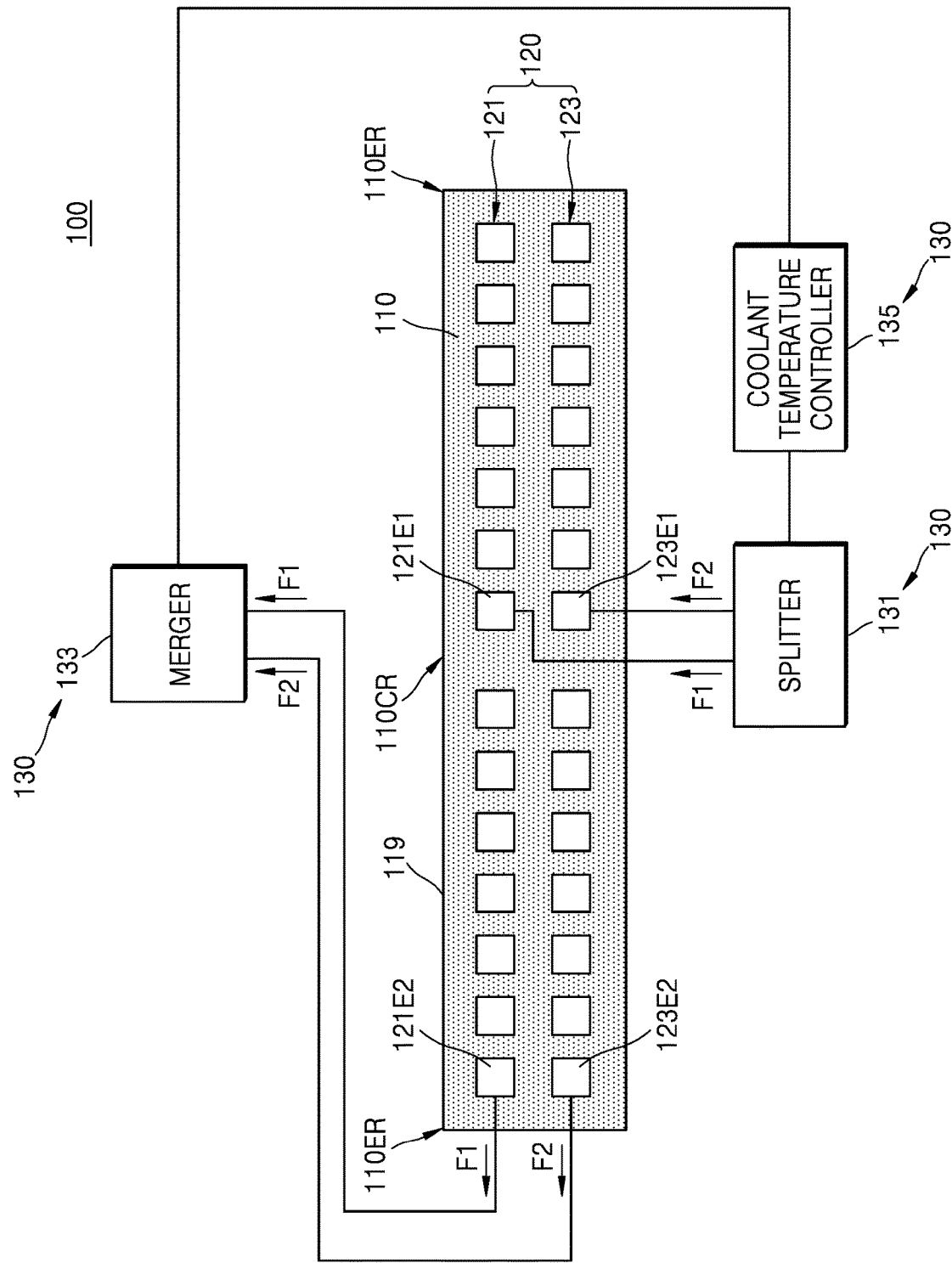
FIG. 7 is a schematic diagram of a plasma processing apparatus according to example embodiments of the inventive concept, in which a cross-section of a substrate support chuck is schematically illustrated to explain a method of adjusting the temperature of a substrate support chuck according to example embodiments of the inventive concept.
Figure 8:
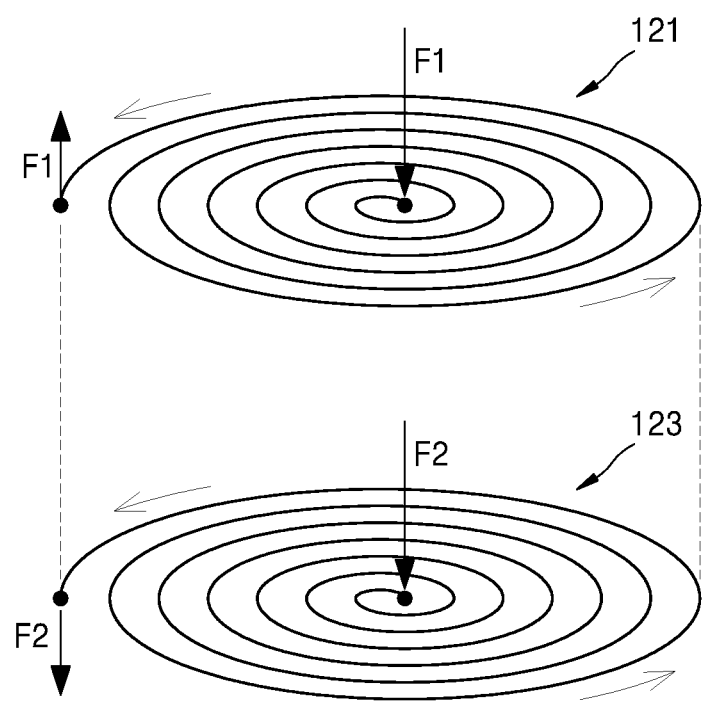
FIG. 8 is a perspective view showing a flow direction of a first coolant in the upper cooling channel and a flow direction of a second coolant in the lower cooling channel of FIG. 7.

FIG. 7 is a schematic diagram of the plasma processing apparatus 100 according to example embodiments of the inventive concept, in which a cross-section of a substrate support chuck 110 is schematically illustrated to explain a method of adjusting the temperature of a substrate support chuck 110 according to example embodiments of the inventive concept. FIG. 8 is a perspective view showing a flow direction of a first coolant F1 in the upper cooling channel 121 and a flow direction of a second coolant F2 in the lower cooling channel 123 in FIG. 7.

Referring to FIGS. 7 and 8, the support chuck temperature controller 130 may flow the first coolant F1 flowing along the upper cooling channel 121 and the second coolant F1 flowing along the lower cooling channel 123 F2 in the same direction.

For example, the support chuck temperature controller 130 may flow the first coolant F1 in a direction from a first end 121E1 of the upper cooling channel 121 toward a second end 121E2 by introducing the first coolant F1 into the first end 121E1 of the upper cooling channel 121. For example, the first coolant F1 may flow into the substrate support chuck 110 through a portion in the vicinity of a center 110CR of the substrate support chuck 110 and may be guided by the upper cooling channel 121 to flow to the vicinity of the edge 110ER of the substrate support chuck 110, and thus may flow out of the substrate support chuck 110 through a portion in the vicinity of the edge 110ER of the substrate support chuck 110.

At the same time, since the support chuck temperature controller 130 allows the second coolant F2 to flow into the third end 123E1 of the lower cooling channel 123, the support chuck temperature controller 130 may allow the second coolant F2 to flow from the third end 123E1 of the lower cooling channel 123 in a direction toward the fourth end 123E2 of the cooling channel 123. For example, similar to a flow path of the first coolant F1, the second coolant F2 may flow into the substrate support through a portion in the vicinity of the center 110CR of the substrate support chuck 110 and may be guided by the lower cooling channel 123 to flow to the vicinity of the edge 110ER of the substrate support chuck 110, and thus may flow out of the substrate support chuck 110 through a portion in the vicinity of the edge 110ER of the substrate support chuck 110.

In this case, the temperature of the first coolant F1 and the temperature of the second coolant F2 may increase as the first coolant F1 and the second coolant F2 approach the edge 110ER of the substrate support chuck 110. Since heat transfer from the substrate support chuck 110 to the first coolant F1 and the second coolant F2 in a region near the center 110CR of the substrate support chuck 110 may be greater than heat transfer from the substrate support chuck 110 to the first coolant F1 and the second coolant F2 in a region near the edge 110ER of the substrate support chuck 110, a temperature profile of the substrate support chuck 110 may be controlled such that the temperature in the vicinity of the edge 110ER of the substrate support chuck 110 is relatively high and the temperature in the vicinity of the center 110CR of the substrate support chuck 110 is relatively low.

Figure 9:
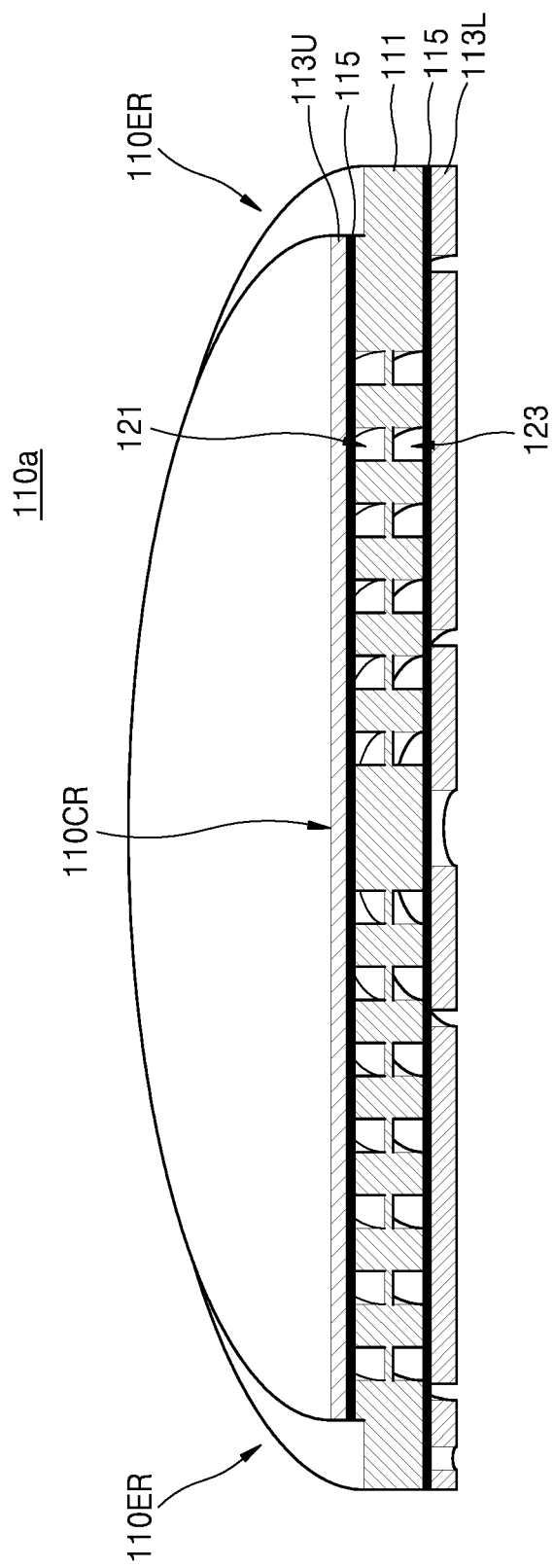
FIG. 9 is a partial cross-sectional and partial perspective view showing a substrate support chuck according to example embodiments of the inventive concept.
Figure 10:
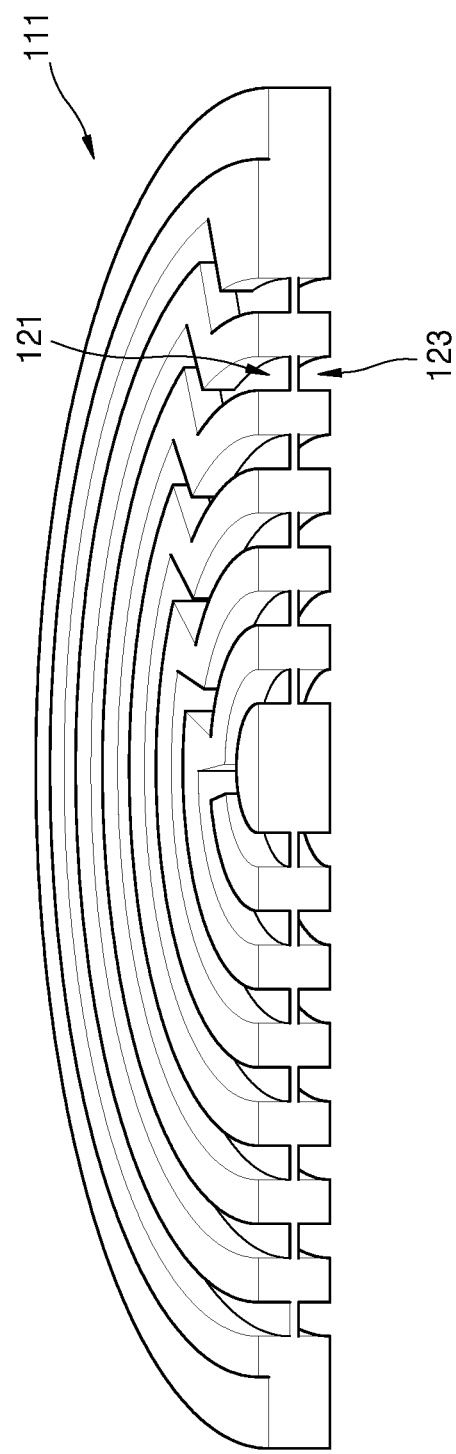
FIG. 10 is a partial cross-sectional and partial perspective view showing a center plate of the substrate support chuck illustrated in FIG. 9.

FIG. 9 is a partial cross-sectional and partial perspective view showing a substrate support chuck 110a according to example embodiments of the inventive concept. FIG. 10 is a partial cross-sectional and partial perspective view showing a center plate 111 of the substrate support chuck 110a illustrated in FIG. 9.

Referring to FIGS. 9 and 10, the substrate support chuck 110a may include a center plate 111, an upper cover plate 113U, and a lower cover plate 113L.

The center plate 111 may have a disk shape and may include an upper cooling channel 121 and a lower cooling channel 123 that are symmetrical to each other in a vertical direction, e.g., with respect to a horizontal plane crossing a center between the upper and lower cooling channel 121 and 123. The upper cooling channel 121 and the lower cooling channel 123 may be separated from each other, e.g., by a wall formed between the upper and lower cooling channels 121 and 123, and a first coolant may flow through the upper cooling channel 121 and a second coolant may flow through the lower cooling channel 123. Each of the upper cooling channel 121 and the lower cooling channel 123 may continuously extend in a spiral direction from the center 110CR of the substrate support chuck 110a toward the edge 110ER of the substrate support chuck 110a.

For example, the upper cooling channel 121 may continuously extend in a spiral direction between a first end of the upper cooling channel 121 adjacent to the center 110CR of the substrate support chuck 110a and a second end of the upper cooling channel 121 adjacent to the edge 110ER of the substrate support chuck 110a.

When the first coolant is introduced into the upper cooling channel 121 through the first end of the upper cooling channel 121, the first coolant may flow in a spiral direction from a region near the center 110CR of the substrate support chuck 110a to a region near the edge 110ER of the substrate support chuck 110a. Alternatively, when the first coolant is introduced into the upper cooling channel 121 through the second end of the upper cooling channel 121, the first coolant may flow in a spiral direction from a region near the edge 110ER of the substrate support chuck 110a to a region near the center 110CR of the substrate support chuck 110a.

Similarly, the lower cooling channel 123 may continuously extend in a spiral direction between the third end 123E1 of the lower cooling channel 123 adjacent to the center 110CR of the substrate support chuck 110a and the fourth end 123E2 of the lower cooling channel 123 adjacent to the edge 110ER of the substrate support chuck 110a.

When the second coolant is introduced into the lower cooling channel 123 through the third end of the lower cooling channel 123, the second coolant may flow in a spiral direction from a region near the center 110CR of the substrate support chuck 110a to a region near the edge 110ER of the substrate support chuck 110a. Alternatively, when the second coolant is introduced into the lower cooling channel 123 through the fourth end of the lower cooling channel 123, the second coolant may flow in a spiral direction from the region near the edge 110ER of the substrate support chuck 110a to the region near the center 110CR of the substrate support chuck 110a.

In example embodiments, each of the upper cooling channel 121 and the lower cooling channel 123 may include a rectangular cross-section such that a contact area between the coolant and the substrate support chuck 110a is widened.

An upper cover plate 113U may have a disk shape and may be provided on an upper surface of the center plate 111. The upper cover plate 113U may cover the upper cooling channel 121 formed to open upwardly from the center plate 111. For example, the upper cover plate 113U may be coupled to the center plate 111 by a brazing method using an adhesive layer 115 interposed between the upper cover plate 113U and the center plate 111.

A lower cover plate 113L may have a circular shape and may be provided on a lower surface of the center plate 111 opposite to an upper surface of the center plate 111. The lower cover plate 113L may cover the lower cooling channel 123 formed to open downward from the center plate 111. For example, the lower cover plate 113L may be coupled to the center plate 111 by a brazing method using an adhesive layer 115 interposed between the lower cover plate 113L and the center plate 111.

Figure 11:
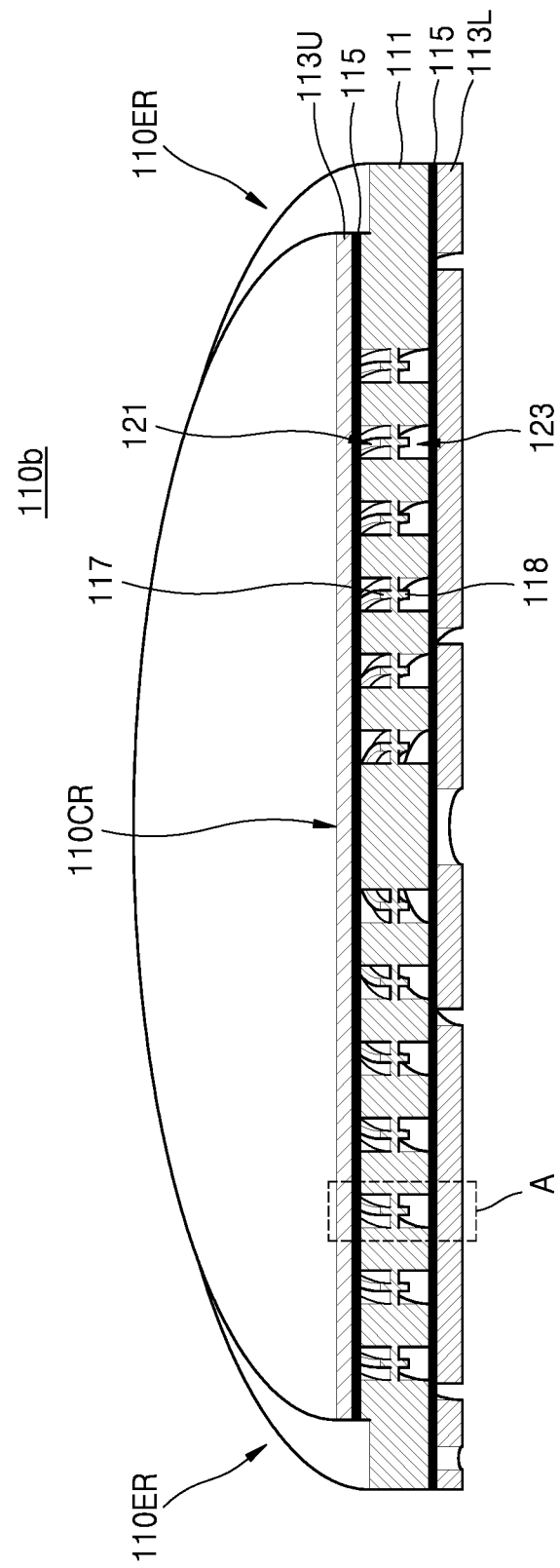
FIG. 11 is a partial cross-sectional and partial perspective view showing a substrate support chuck according to example embodiments of the inventive concept.
Figure 12:
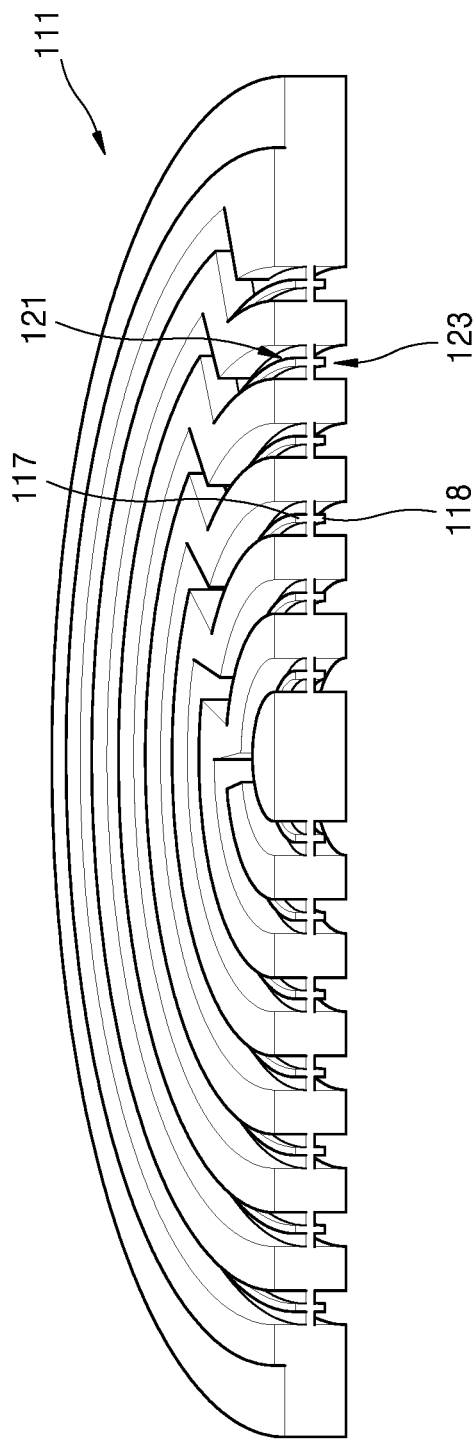
FIG. 12 is a partial cross-sectional and partial perspective view of a center plate of the substrate support chuck illustrated in FIG. 11.
Figure 13:
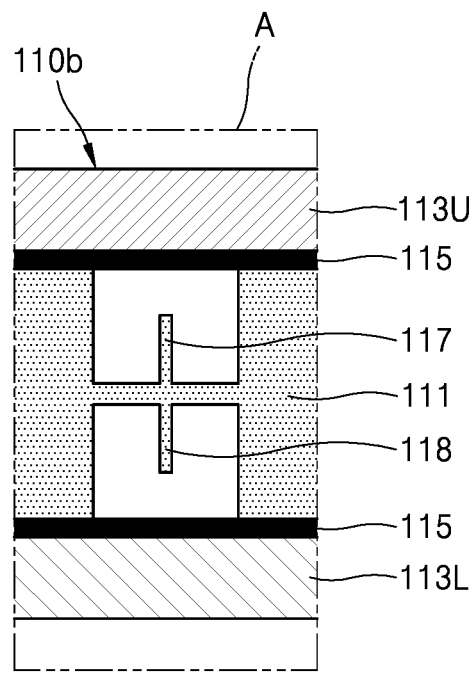
FIG. 13 is an enlarged cross-sectional view showing a portion indicated by "A" in FIG. 11.

FIG. 11 is a partial cross-sectional and partial perspective view showing a substrate support chuck 110b according to example embodiments of the inventive concept. FIG. 12 is a partial cross-sectional and partial perspective view showing a center plate 111 of the substrate support chuck 110b shown in FIG. 11. FIG. 13 is an enlarged cross-sectional view showing a portion indicated by "A" in FIG. 11. The substrate support chuck 110b illustrated in FIGS. 11 to 13 may be substantially the same as the substrate support chuck 110a described with reference to FIGS. 9 and 10, except that the substrate support chuck 110b further includes a first fin portion 117 and a second fin portion 118. In descriptions of embodiments illustrated in FIGS. 11 to 13, the same contents as those described above may be omitted. The first fin portion 117 and the second fin portion 118 may indicate portions of the first and second fins 117 and 118 or may indicate the first and second fins 117 and 118 themselves depending on the context throughout the disclosure.

Referring to FIGS. 11 to 13, the substrate support chuck 110b may include a center plate 111, an upper cover plate 113U, and a lower cover plate 113L. The center plate 111 may include an upper cooling channel 121 and a lower cooling channel 123 that are symmetrical in a vertical direction, e.g., with respect to a horizontal plane crossing a center between the upper and lower cooling channels 121 and 123, and may include a first fin portion 117 protruding from the inner wall of the upper cooling channel 121 and a second fin portion 118 protruding from the inner wall of the cooling channel 123.

The first fin portion 117 may protrude upwardly from an inner wall of the upper cooling channel 121 and may extend along the upper cooling channel 121. For example, the first fin portion 117 may continuously extend in a spiral direction from the center 110CR of the substrate support chuck 110b toward the edge 110ER of the substrate support chuck 110b. Alternatively, the first fin portion 117 may discontinuously extend in a spiral direction from the center 110CR of the substrate support chuck 110b toward the edge 110ER of the substrate support chuck 110b. For example, discrete/separate patterns of fin 117 may be arranged along the bottom surface of the upper cooling channel 121.

The second fin portion 118 may protrude downward from an inner wall of the lower cooling channel 123 and may continuously extend along the lower cooling channel 123. The second fin portion 118 may be symmetrical to the first fin portion 117 with respect to a plane crossing the center plate 111, e.g., a plane crossing the center of the center plate 111 and parallel with the top and/or bottom surface of the center plate 111. For example, the second fin portion 118 may continuously extend in the spiral direction from the center 110CR of the substrate support chuck 110b toward the edge 110ER of the substrate support chuck 110b. Alternatively, the second fin portion 118 may discontinuously extend in the spiral direction from the center 110CR of the substrate support chuck 110b toward the edge 110ER of the substrate support chuck 110b. For example, discrete/separate patterns of fin 118 may be arranged along the bottom surface of the upper cooling channel 121.

The first fin portion 117 may increase a contact area between the first coolant flowing along the upper cooling channel 121 and the substrate support chuck 110b, and the second fin portion 118 may increase a contact area between a second coolant flowing along the lower cooling channel 123 and the substrate support chuck 110b. Since a contact area between a coolant and the substrate support chuck 110b is increased by the first fin portion 117 and the second fin portion 118, the heat transfer efficiency between the coolant and the substrate support chuck 110 may be improved.

Figure 14:
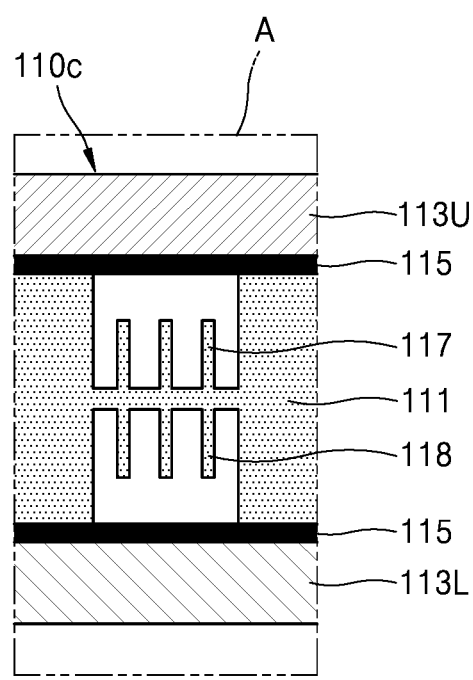
FIG. 14 is a cross-sectional view for explaining a substrate support chuck according to some example embodiments of the inventive concept and is a cross-sectional view showing a part of a substrate support chuck corresponding to the portion indicated by "A" in FIG. 11.

FIG. 14 is a cross-sectional view for explaining a substrate support chuck 110c according to example embodiments of the inventive concept, and is a cross-sectional view showing a part of a substrate support chuck 110c corresponding to a portion indicated by "A" in FIG. 11. The substrate support chuck 110c illustrated in FIG. 14 may be substantially the same as the substrate support chuck 110c described with reference to FIGS. 11 to 13 except that the substrate support chuck 110c includes a plurality of first fin portions 117 and a plurality of second fin portions 118. In descriptions of embodiments illustrated in FIG. 14, the same contents as those described above may be omitted.

Referring to FIG. 14, the substrate support chuck 110c may include a center plate 111, an upper cover plate 113U, and a lower cover plate 113L. The center plate 111 may include an upper cooling channel 121 and a lower cooling channel 123 that are symmetrical in the vertical direction, e.g., with respect to a horizontal plane, and may include a plurality of first fin portions 117 protruding from an inner wall of the upper cooling channel 121 and a plurality of second fin portions 118 protruding from an inner wall of the lower cooling channel 123. For example, a plurality of first fins 117 may be formed on the bottom surface of the upper cooling channel 121, and a plurality of second fins 118 may be formed on the upper surface of the lower cooling channel 123.

The plurality of first fin portions 117 may protrude upward from the inner wall of the upper cooling channel 121. The plurality of first fin portions 117 may extend along the extending direction of the upper cooling channel 121 and may extend parallel to each other.

The plurality of second fin portions 118 may protrude downward from the inner wall of the lower cooling channel 123. The plurality of second fin portions 118 may be symmetrical to the plurality of first fin portions 117 with respect to a plane crossing the center plate 111, e.g., with respect to a plane crossing the center of the center plate 111 in parallel to the upper and/or lower surface of the center plate 111. The plurality of second fin portions 118 may extend along the extending direction of the lower cooling channel 123 and may extend parallel to each other.

In FIG. 14, although three fin portions are shown as being included in each of the upper cooling channel 121 and the lower cooling channel 123, the number of the fin portions provided in the upper cooling channel 121 and the lower cooling channel 123 is not limited thereto. For example, the upper cooling channel 121 and the lower cooling channel 123 may be provided with two or four or more pins. In certain embodiments, a fin or plural fins may be formed on side walls or the upper surface of the upper cooling channel 121, and/or a fin or plural fins may be formed on side walls or the lower surface of the lower cooling channel 123.

Figure 15:
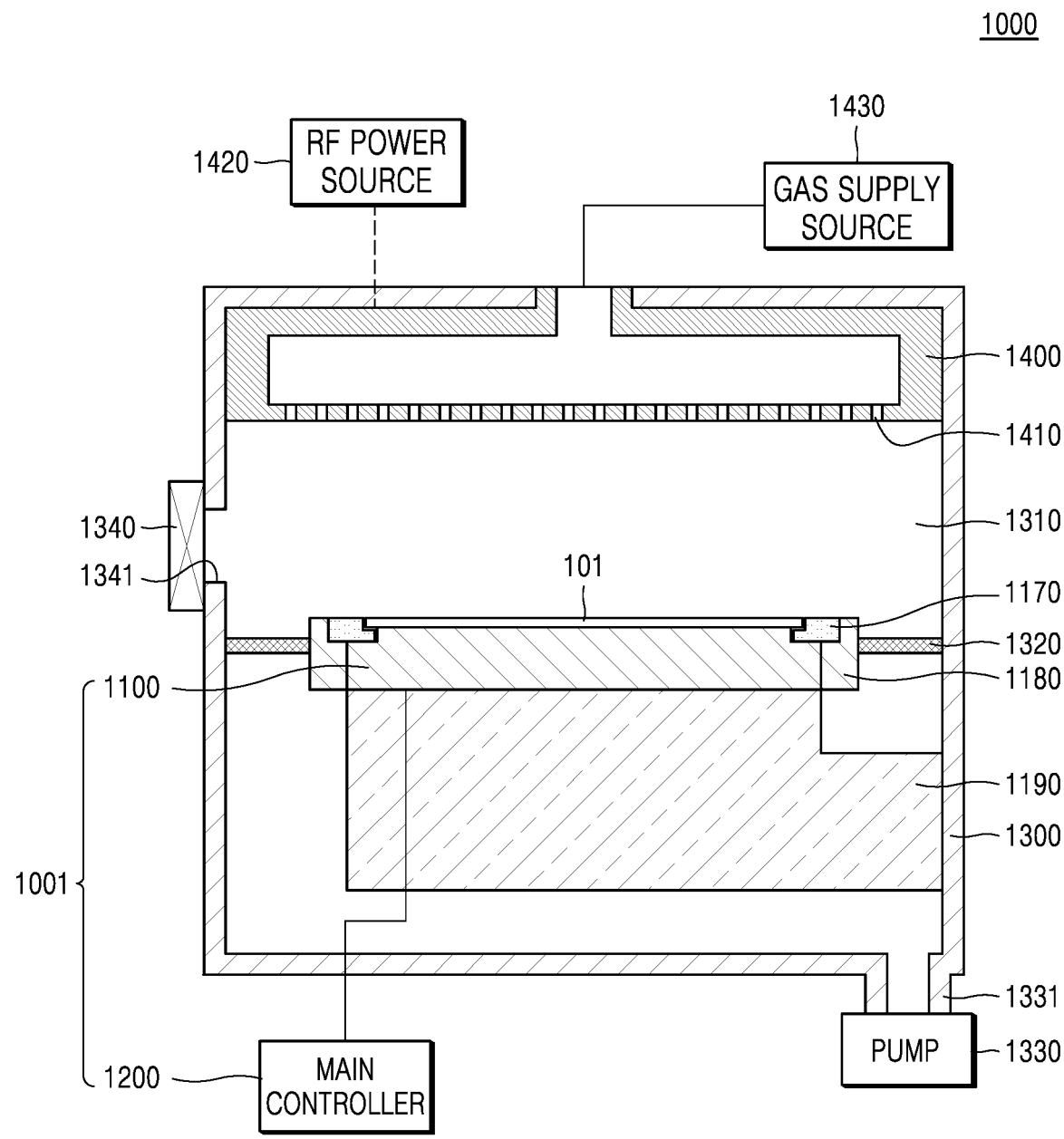
FIG. 15 is a cross-sectional view showing a plasma processing apparatus according to example embodiments of the inventive concept.
Figure 16:
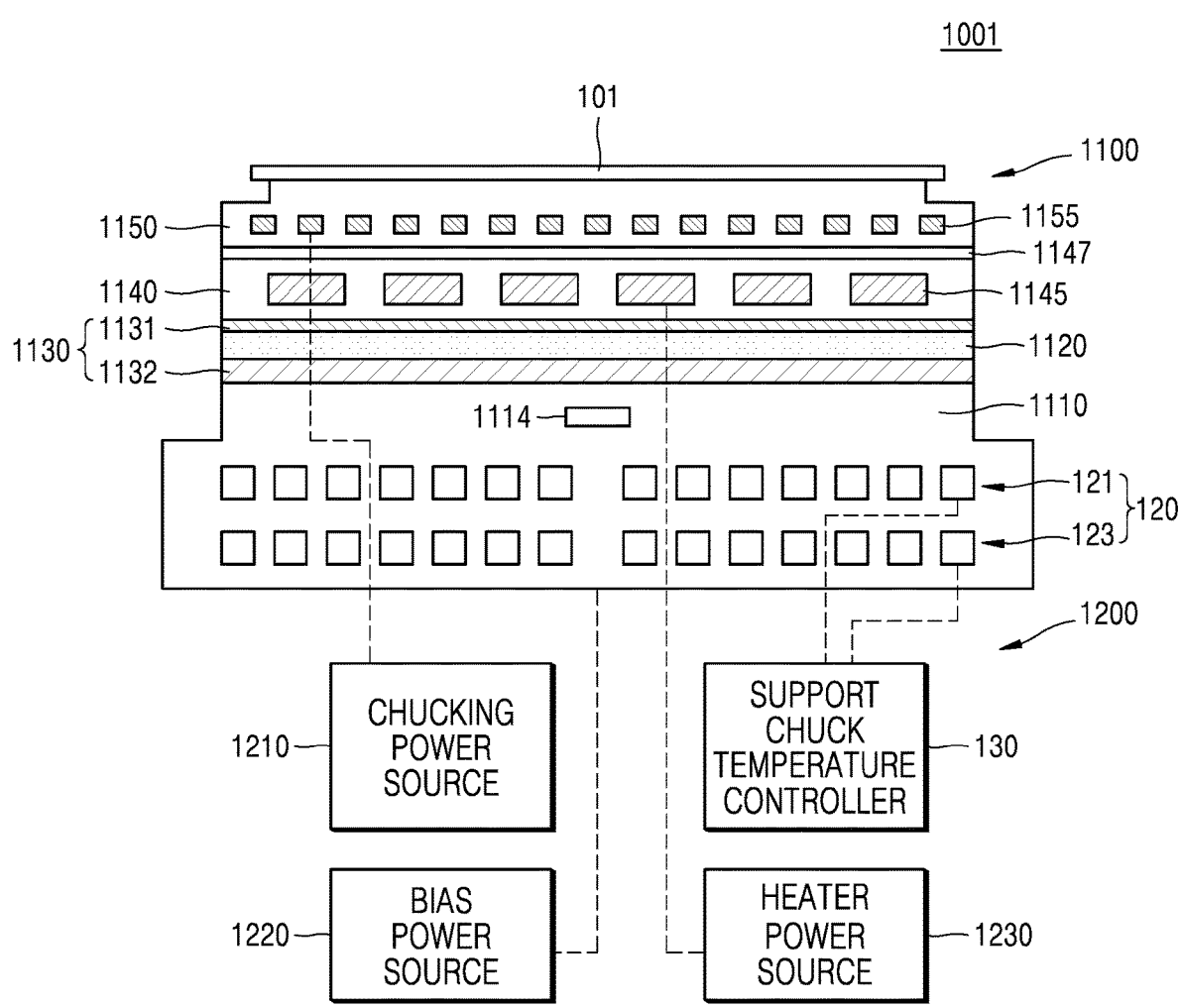
FIG. 16 is a cross-sectional view showing a substrate support chuck assembly shown in FIG. 15 in detail.

FIG. 15 is a cross-sectional view showing the plasma processing apparatus 1000 according to example embodiments of the inventive concept. FIG. 16 is a cross-sectional view showing a substrate support chuck assembly 1001 shown in FIG. 15 in more detail.

Referring to FIGS. 15 and 16, a capacitively coupled plasma etching apparatus is shown as an example of the plasma processing apparatus 1000 of the present embodiment. However, the invention is not limited to a capacitively coupled plasma etching apparatus, and may be applied to any apparatus using plasma. For example, the present embodiment may be applied to an inductively coupled plasma etching apparatus or a plasma deposition apparatus.

The plasma processing apparatus 1000 may be a plasma etching apparatus capable of processing a substrate 101 in the processing chamber 1300 using plasma, for example, a plasma etching process. The substrate 101 may be a wafer, for example, a silicon wafer. A material film, for example, an oxide film or a nitride film, may be formed on the substrate 101. The process chamber 1300 may be a chamber including an inner space 1310, for example, a plasma chamber.

The plasma processing apparatus 1000 may include the substrate support chuck assembly 1001 having a substrate support chuck 1100 on which the substrate 101 is mounted in a process chamber 1300. The substrate support chuck assembly 1001 may include the substrate support chuck 1100 for fixing the substrate 101 on the substrate support chuck 1100 and a main controller 1200 for controlling an operation of the substrate support chuck 1100. The substrate support chuck 1100 may be one of the substrate support chucks 110, 110a, 110b, and 110c described with reference to FIGS. 1 to 14.

The substrate support chuck 1100 may be an electrostatic chuck for fixing the substrate 101 on the substrate support chuck 1100 by electrostatic force. In this case, the substrate support chuck 1100 may include a base 1110, a heater dielectric layer 1140 bonded to the base 1110 by an adhesive layer 1130, and an electrostatic dielectric layer 1150. The adhesive layer 1130 may be a double-layer structure including a first adhesive 1131 and a second adhesive 1132. A metal plate 1120 may be further provided between the first adhesive 1131 and the second adhesive 1132. The base 1110 may have a circular shape. The base 1110 may be composed of a metal, for example, a metal such as aluminum (Al), titanium (Ti), stainless steel, tungsten (W), or an alloy thereof.

The base 1110 may be provided with a cooling channel 120 through which a coolant flows. The cooling channel 120 may include an upper cooling channel 121 and a lower cooling channel 123 that are symmetrical in a vertical direction. For example, the upper cooling channel 121 may be symmetrical to the lower cooling channel 123 with respect to a plane crossing a center between the upper cooling channel 121 and the lower cooling channel 124. The flow rate, direction and/or temperature of a first coolant circulating through the upper cooling channel 121 may be adjusted by the support chuck temperature controller 130, and the flow rate, direction and/or temperature of a second coolant circulating through the lower cooling channel 123 may be adjusted by the support chuck temperature controller 130.

The base 1110 may be electrically coupled to a bias power source 1220. The power generated by the bias power source 1220 may be applied to the base 1110, and thus the base 1110 may serve as an electrode for plasma generation.

The base 1110 may include a temperature sensor 1114. The temperature sensor 1114 may transmit a measured temperature of the base 1110 to the main controller 1200. The main controller 1200 may detect the temperature of the substrate support chuck 1100 or the temperature of the substrate 101 based on the temperature measured by the temperature sensor 1114.

A heater dielectric layer 1140 may include an embedded heater electrode 1145. The heater dielectric layer 1140 may be comprised of a dielectric such as a ceramic, for example, aluminum oxide ($Al_2O_3$), aluminum nitride (AlN), yttrium oxide (Y2O3), or resin, for example, a dielectric such as polyimide. The heater dielectric layer 1140 may be a circular shape or a disk shape.

The heater electrode 1145 may be formed of a conductor, for example, a metal such as tungsten (W), copper (Cu), Nickel (Ni), molybdenum (Mo), titanium (Ti), nickel-chromium alloy (Ni—Cr alloy), or nickel-aluminum alloy (Ni—Al alloy), or a conductive ceramic such as tungsten carbide (WC), molybdenum carbide (MoC), and titanium nitride (TiN).

The heater electrode 1145 may be electrically connected to a heater power source 1230. The heater electrode 1145 may be heated by a power source, for example, an AC voltage, from the heater power source 1230, and thus the temperature of the substrate support chuck 1100 and the substrate 101 may be adjusted. The heater electrode 1145 may have a concentric or spiral pattern with respect to a central axis of the heater dielectric layer 1140, e.g., an axis passing perpendicularly to and through a center of a top/bottom surface the heater dielectric layer 1140.

The electrostatic dielectric layer 1150 may include an embedded adsorption electrode 1155. The adsorption electrode 1155 may be referred to as a clamp electrode. The electrostatic dielectric layer 1150 may be comprised of a dielectric such as a ceramic, for example, aluminum oxide (Al2O3), aluminum nitride (AlN), yttrium oxide (Y2O3) or a resin, for example, a dielectric such as polyimide. The electrostatic dielectric layer 1150 may be a circular shape or a disc shape.

The substrate 101 may be arranged on the electrostatic dielectric layer 1150. The adsorption electrode 1155 may be formed of a metal such as tungsten (W), copper (Cu), nickel (Ni), molybdenum (Mo), nickel-chromium alloy (Ni—Cr alloy), and nickel-aluminum alloy (Ni—Al alloy), or a conductive ceramic such as tungsten carbide (WC), molybdenum carbide (MoC), and titanium nitride (TiN).

The adsorption electrode 1155 may be electrically connected to a chucking power source 1210. Since an electrostatic force is generated between the adsorption electrode 1155 and the substrate 101 by a power applied from the chucking power source 1210, for example, a DC voltage, the substrate 101 may be adsorbed on the electrostatic dielectric layer 1150.

A heat distribution layer 1147 may be provided between the heater dielectric layer 1140 and the electrostatic dielectric layer 1150. The heat distribution layer 1147 may include, for example, aluminum nitride (AlN), boron nitride (BN), tungsten (W), molybdenum (Mo), and the like, each having a thermal conductivity of about 10 W/mK or more. The heat distribution layer 1147 may make the heat generated in the heater electrode 1145 more uniform. For example, the heat distribution layer 1147 may be helpful in uniformly transferring the heat generated from the heater electrode 1145 to the electrostatic dielectric layer 1150.

The chucking power source 1210, the bias power source 1220, the heater power source 1230 and the support chuck temperature controller 130 may constitute the main controller 1200. For example, the main controller 1200 may detect the temperature of the substrate support chuck 1100 and the substrate 101 based on the measured temperature from the temperature sensor 1114. Furthermore, the main controller 1200 may drive the heater power source 1230 based on the detected temperature information to adjust the amount of heat generated from the heater electrode 1145, or may drive the support chuck temperature controller 130 to adjust the temperature of the substrate support chuck 1100. Accordingly, the temperature of the substrate support chuck 1100 and/or the temperature of the substrate 101 may be appropriately controlled.

The substrate support chuck 1100 may be supported by a support base 1190. An edge ring 1170 surrounding an edge of the substrate 101 and a cover ring 1180 surrounding the edge of the edge ring 1170 and the edge of the substrate support chuck 1100 may be provided on the substrate support chuck 1100.

A baffle plate 1320 may be provided between the substrate support chuck 1100 and an inner wall of the process chamber 1300. An exhaust pipe 1331 may be provided below the process chamber 1300 and the exhaust pipe 1331 may be connected to a vacuum pump 1330. A gate valve 1340 may be provided on an outer wall of the process chamber 1300 to open and close an opening 1341 for carrying in and carrying out the substrate 101.

An upper electrode 1400 spaced upward from the substrate support chuck 1100 may be provided on the ceiling of the process chamber 1300. The upper electrode 1400 may be electrically coupled to an RF power source 1420. The RF power source 1420 may apply an RF power suitable for generating plasma to an upper electrode 1400. The upper electrode 1400 may be connected to a gas supply source 1430 that supplies a process gas. For example, the upper electrode 1400 may be a showerhead electrode. The process gas supplied from the gas supply source 1430 may be injected into an inside portion of the process chamber 1300 through an injection holes 1410 of the upper electrode 1400.

Figure 17:
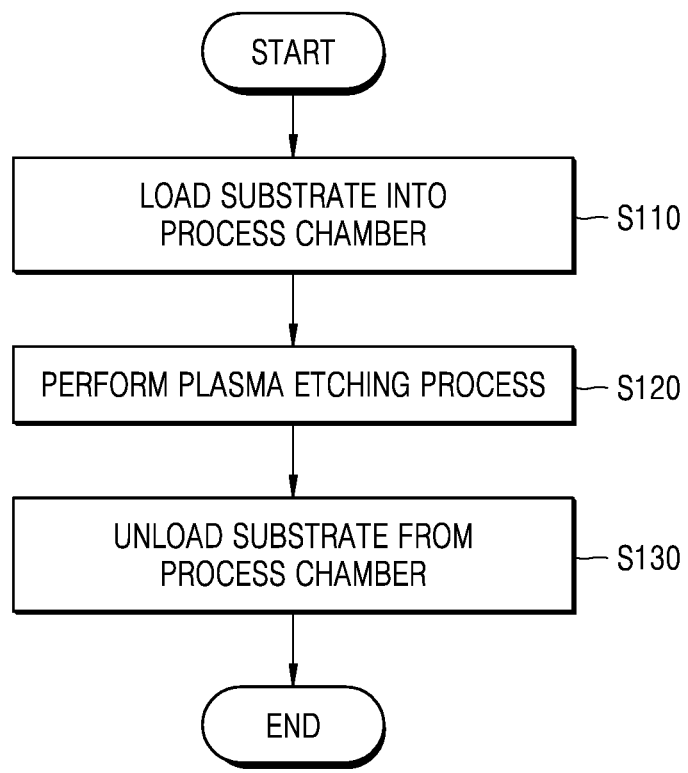
FIG. 17 is a flowchart for explaining a method of manufacturing a semiconductor device using a plasma processing apparatus according to example embodiments of the inventive concept.
Figure 18A:
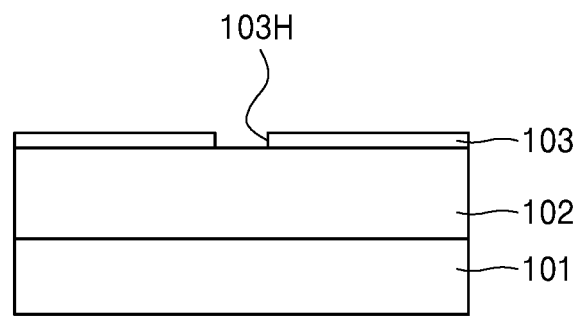
FIGS. 18A and 18B are views for explaining a plasma etching process illustrated in FIG. 17.
Figure 18B:
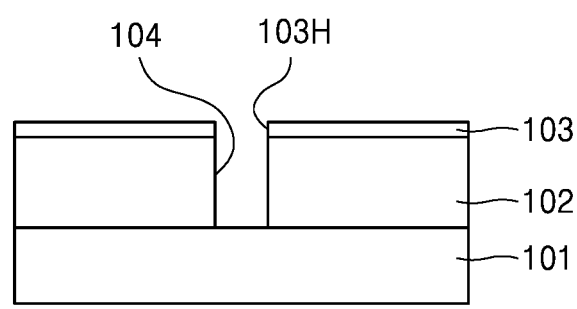

FIG. 17 is a flowchart for explaining a method of manufacturing a semiconductor device using a plasma processing apparatus according to example embodiments of the inventive concept. FIGS. 18A and 18B are cross-sectional views for explaining the plasma etching process illustrated in FIG. 17. Hereinafter, with reference to FIGS. 17, 18A, and 18B together with FIGS. 15 and 16, a method of manufacturing a semiconductor device using a plasma processing apparatus 1000 according to example embodiments of the inventive concept will be described.

Referring to FIG. 17, in S110, the substrate 101 may be loaded into the process chamber 1300. For example, the gate valve 1340 may be opened to load (or mount) the substrate 101 on the substrate support chuck 1100 in the process chamber 1300. The substrate support chuck 1100 may fix the substrate 101 on the substrate support chuck 110 through the electrostatic force generated by a power applied from the chucking power source 1210.

Next, in S120, when the substrate 101 is fixed to the substrate support chuck 1110, a plasma etching process may be performed on the substrate 101.

Referring to FIG. 18A, before performing the plasma etching process and/or before loading the substrate 101 on the substrate support chuck 110, a first material film 102 and a mask pattern 103 may be formed on the substrate 101. The mask pattern 103 may have an opening 103H exposing a part of the first material film 102.

Referring to FIG. 18B, a plasma may be generated in the process chamber 1300 to remove a part of the first material film 102 exposed by the mask pattern 103, and thus a hole 104 may be formed in the first material film 102. After the hole 104 is formed in the first material film 102, the mask pattern 103 may be removed.

For example, the process gas supplied from the gas supply source 1430 may be uniformly diffused into an inner space 1310 of the process chamber 1300 through the upper electrode 1400. As the RF power generated in the RF power source 1420 is applied to the upper electrode 1400 through an impedance matcher and a bias power generated from the bias power source 1220 is applied to the substrate support chuck 1100. An electric field may be formed between the upper electrode 1400 and the substrate support chuck 1100. Electrons accelerated by the electric field may collide with the molecules or atoms of the process gas to generate plasma in the inner space 1310 of the process chamber 1300. The substrate 101 mounted on the substrate support chuck 1110 may be exposed to the plasma generated in the process chamber 1300 and the first material film 102 on the substrate 101 may be etched by physically and/or chemically reacting with the plasma.

Meanwhile, the plasma processing apparatus 1000 may perform the etching process for the first material film 102 under high RF power conditions and cryogenic temperature conditions. At this time, the support chuck temperature controller 130 may supply the coolant to the cooling channel 120 to control/adjust the temperature of the substrate support chuck 1100 to a predetermined temperature. For example, the support chuck temperature controller 130 may adjust the flow directions, flow rates, and/or temperatures of the first coolant flowing along the upper cooling channel 121 and the second coolant flowing along the lower cooling channel 123 to control the temperature, the temperature profile of the substrate support chuck 1100 and the temperature profile of the substrate 101 on the substrate support chuck 1100.

In example embodiments, the support chuck temperature controller 130 causes/controls the first coolant and the second coolant to flow in the directions opposite to each other, and the temperature of the substrate support chuck 1100 may be uniformly controlled/adjusted as a whole between the center of the substrate support chuck 1100 and the edge of the substrate support chuck 1100. During the plasma etching process, the substrate 101 may have a uniform temperature as a whole to improve the uniformity of the etching process.

Next, in S130, when the plasma etching process for the substrate 101 is completed, the substrate 101 may be unloaded from the process chamber 1300.

According to example embodiments of the inventive concept, during the plasma etching process, since the temperature of the substrate support chuck 1100 is uniformly controlled as a whole, the uniformity of the etching process may be improved. Furthermore, since the heat transfer efficiency between the substrate support chuck 1100 and the coolant flowing along the cooling channel 120 is improved, it may be beneficial to perform the etching process with high aspect ratio characteristics under the high RF power conditions and the cryogenic temperature conditions.

As described above, example embodiments have been disclosed in the drawings and specification. Although example embodiments have been described herein with reference to specific terms, the specific terms are used for purposes of describing the technical idea of the present disclosure and not for limiting the scope of the present disclosure as defined in the claims. Therefore, it will be understood by those skilled in the art that various modifications and equivalent embodiments may be made without departing from the scope of the present disclosure. Accordingly, the true scope of protection of the present disclosure should be determined by the terms of the appended claims.

While the inventive concept has been particularly shown and described with reference to embodiments thereof, it will be understood that various changes in form and details may be made therein without departing from the spirit and scope of the following claims.

What is claimed is:

1. A method of manufacturing a semiconductor device, the method comprising:
    a substrate loading operation of loading a substrate on a substrate support chuck provided in a process chamber, the substrate having a material film and a mask pattern having an opening for exposing part of the material film; and
    a plasma etching operation of removing the part of the material film exposed through the opening of the mask pattern, by generating plasma in the process chamber,
    wherein the substrate support chuck comprises:
        a center plate;
        an upper cooling channel provided in the center plate, the upper cooling channel extending in a spiral direction from a first end adjacent to a center of the substrate support chuck to a second end adjacent to an edge of the substrate support chuck;
        a lower cooling channel provided in the center plate, the lower cooling channel extending in a spiral direction from a third end adjacent to the center of the substrate support chuck to a fourth end adjacent to the edge of the substrate support chuck;
an upper cover plate attached to an upper surface of the center plate to cover the upper cooling channel, the upper cover plate closing a upwardly open portion of the upper cooling channel;
a lower cover plate attached to a lower surface of the center plate opposite to the upper surface of the center plate to cover the lower cooling channel, the lower cover plate closing a downwardly open portion of the lower cooling channel; and
a first fin protruding from an inner wall of the upper cooling channel and a second fin protruding from an inner wall of the lower cooling channel, the first fin spirally extending along an extending direction of the upper cooling channel, and the second fin spirally extending along an extending direction of the lower cooling channel,
wherein the plasma etching operation comprises adjusting a temperature of the substrate support chuck by supplying a first coolant to the upper cooling channel and a second coolant to the lower cooling channel,
wherein the upper cooling channel is separated from the lower cooling channel such that the first coolant is not mixed with the second coolant within the substrate support chuck,
wherein a thickness of the center plate is greater than a thickness of the upper cover plate and greater than a thickness of the lower cover plate, in a vertical direction,
wherein, when viewed in a cross section of the substrate support chuck, the upper cooling channel and the lower cooling channel are mirror-symmetric with respect to a plane horizontally traversing the center plate, and
wherein, in the plasma etching operation, while the part of the material film is removed, the temperature of the substrate support chuck is adjusted between about −50° C. and about −100° C.

2. The method of claim 1, wherein the plasma etching operation further comprises determining a flow direction of the first coolant in the upper cooling channel and a flow direction of the second coolant in the lower cooling channel.

3. The method of claim 1, wherein the first end of the upper cooling channel is an outlet of the upper cooling channel through which the first coolant flows out,
wherein the second end of the upper cooling channel is an inlet of the upper cooling channel through which the first coolant flows in,
wherein the third end of the lower cooling channel is an inlet of the lower cooling channel through which the second coolant flows in,
wherein the fourth end of the lower cooling channel is an outlet of the lower cooling channel through which the second coolant flows out, and
wherein the plasma etching operation comprises supplying the first coolant to the second end of the upper cooling channel, and the second coolant to the third end of the lower cooling channel.

4. The method of claim 1, wherein the first end of the upper cooling channel is an outlet of the upper cooling channel through which the first coolant flows out,
wherein the second end of the upper cooling channel is an inlet of the upper cooling channel through which the first coolant flows in,
wherein the third end of the lower cooling channel is an outlet of the lower cooling channel through which the second coolant flows out,
wherein the fourth end of the lower cooling channel is an inlet of the lower cooling channel through which the second coolant flows in, and
wherein the plasma etching operation comprises supplying the first coolant to the second end of the upper cooling channel, and the second coolant to the fourth end of the lower cooling channel.

5. The method of claim 1, wherein the first end of the upper cooling channel is an inlet of the upper cooling channel through which the first coolant flows in,
wherein the second end of the upper cooling channel is an outlet of the upper cooling channel through which the first coolant flows out,
wherein the third end of the lower cooling channel is an inlet of the lower cooling channel through which the second coolant flows in,
wherein the fourth end of the lower cooling channel is an outlet of the lower cooling channel through which the second coolant flows out, and
wherein the plasma etching operation comprises supplying the first coolant to the first end of the upper cooling channel, and the second coolant to the third end of the lower cooling channel.

6. The method of claim 1, wherein the plasma etching operation further comprises determining a flow rate of the first coolant and a flow rate of the second coolant.

7. The method of claim 6, wherein the flow rate of the first coolant and the flow rate of the second coolant are different from each other.

8. The method of claim 6, wherein the flow rate of the first coolant and the flow rate of the second coolant are identical to each other.

9. The method of claim 1, further comprising:
merging the first coolant flowing out from an outlet of the upper cooling channel and the second coolant flowing out from an outlet of the lower cooling channel;
adjusting a temperature of a merged coolant of the first coolant and the second coolant; and
separating the merged coolant into two coolants, and
supplying one of the two coolants into an inlet of the upper cooling channel and the other one of the two coolants into an inlet of the lower cooling channel.

10. The method of claim 1, wherein the first fin comprises a plurality of fin portions extending parallel to each other, and
wherein the second fin comprises a plurality of fin portions extending parallel to each other.

11. The method of claim 1, wherein a radial distance between the edge of the substrate support chuck and the first end of the upper cooling channel is greater than a radial distance between the edge of the substrate support chuck and the second end of the upper cooling channel, and
wherein a radial distance between the edge of the substrate support chuck and the third end of the lower cooling channel is greater than a radial distance between the edge of the substrate support chuck and the fourth end of the lower cooling channel.

12. The method of claim 1, wherein the upper cover plate is attached to the center plate by a first adhesive layer, and
wherein the lower cover plate is attached to the center plate by a second adhesive layer.

13. The method of claim 1, wherein the substrate support chuck further comprises:
an electrostatic dielectric layer in contact with the substrate;

an adsorption electrode provided in the electrostatic dielectric layer, and configured to generate an electrostatic force to support the substrate; and
a chucking power source supplying power to the adsorption electrode.

14. The method of claim 13, wherein the substrate support chuck further comprises:
a heater dielectric layer provided between the electrostatic dielectric layer and the upper cooling channel;
a heater electrode provided in the heater dielectric layer; and
a heater power source supplying power to the heater electrode.

15. The method of claim 1, wherein the plasma etching operation comprises forming a hole penetrating the material film by removing the part of the material film.

16. A method of manufacturing a semiconductor device, the method comprising:
a substrate loading operation of loading a substrate on a substrate support chuck provided in a process chamber, the substrate having a material film and a mask pattern having an opening for exposing part of the material film; and
a plasma etching operation of removing the part of the material film exposed through the opening of the mask pattern, by generating plasma in the process chamber,
wherein the substrate support chuck comprises:
a center plate;
an upper cooling channel provided in the center plate, the upper cooling channel extending in a spiral direction from a first inlet through which a first coolant is introduced and a first outlet through which the first coolant is discharged, wherein a radial distance between an edge of the substrate support chuck and the first inlet of the upper cooling channel is smaller than a radial distance between the edge of the substrate support chuck and the first outlet of the upper cooling channel;
a lower cooling channel provided in the center plate, the lower cooling channel extending in a spiral direction from a second inlet through which a second coolant is introduced and a second outlet through which the second coolant is discharged, wherein a radial distance between an edge of the substrate support chuck and the second inlet of the lower cooling channel is greater than a radial distance between the edge of the substrate support chuck and the second outlet of the lower cooling channel;
an upper cover plate attached to an upper surface of the center plate to cover the upper cooling channel, the upper cover plate closing a upwardly open portion of the upper cooling channel;
a lower cover plate attached to a lower surface of the center plate opposite to the upper surface of the center plate to cover the lower cooling channel, the lower cover plate closing a downwardly open portion of the lower cooling channel; and
a first fin protruding from an inner wall of the upper cooling channel and a second fin protruding from an inner wall of the lower cooling channel, the first fin spirally extending along an extending direction of the upper cooling channel, and the second fin spirally extending along an extending direction of the lower cooling channel, wherein the upper cooling channel is separated from the lower cooling channel such that the first coolant is not mixed with the second coolant within the substrate support chuck,
wherein a thickness of the center plate is greater than a thickness of the upper cover plate and greater than a thickness of the lower cover plate, in a vertical direction,
wherein, when viewed in a cross section of the substrate support chuck, the upper cooling channel and the lower cooling channel are mirror-symmetric with respect to a plane horizontally traversing the center plate, and
wherein the plasma etching operation comprises adjusting a temperature of the substrate support chuck by supplying the first coolant to the first inlet of the upper cooling channel and the second coolant to the second inlet of the lower cooling channel.

17. The method of claim 16, wherein, in the plasma etching operation, while the part of the material film is removed, the temperature of the substrate support chuck is adjusted between about −50° C. and about −100° C.

18. The method of claim 16, wherein the substrate support chuck further comprises:
an electrostatic dielectric layer in contact with the substrate;
an adsorption electrode provided in the electrostatic dielectric layer and configured to generate an electrostatic force to support the substrate;
a chucking power source supplying power to the adsorption electrode;
a heater dielectric layer provided between the electrostatic dielectric layer and the upper cooling channel;
a heater electrode provided in the heater dielectric layer; and
a heater power source supplying power to the heater electrode.

19. The method of claim 16, wherein the upper cover plate and the lower cover plate are attached to the center plate by a brazing method.

20. A method of manufacturing a semiconductor device, the method comprising:
a substrate loading operation of loading a substrate on a substrate support chuck provided in a process chamber, the substrate having a material film and a mask pattern having an opening for exposing part of the material film; and
a plasma etching operation comprising generating plasma in the process chamber and forming a hole penetrating the material film by removing the part of the material film exposed through the opening of the mask pattern,
wherein the substrate support chuck comprises:
a center plate;
an upper cooling channel provided in the center plate, the upper cooling channel extending in a spiral direction from a first inlet through which a first coolant is introduced and a first outlet through which the first coolant is discharged, wherein a radial distance between an edge of the substrate support chuck and the first inlet of the upper cooling channel is smaller than a radial distance between the edge of the substrate support chuck and the first outlet of the upper cooling channel;
a lower cooling channel provided in the center plate, the lower cooling channel extending in a spiral direction from a second inlet through which a second coolant is introduced and a second outlet through which the second coolant is discharged, wherein a radial distance between an edge of the substrate support chuck and the second inlet of the lower cooling channel is greater than a radial distance between the edge of the substrate support chuck and the second outlet of the lower cooling channel;

an upper cover plate attached to an upper surface of the center plate to cover the upper cooling channel, the upper cover plate closing a upwardly open portion of the upper cooling channel;

a lower cover plate attached to a lower surface of the center plate opposite to the upper surface of the center plate to cover the lower cooling channel, the lower cover plate closing a downwardly open portion of the lower cooling channel;

a first fin protruding from an inner wall of the upper cooling channel and a second fin protruding from an inner wall of the lower cooling channel, the first fin spirally extending along an extending direction of the upper cooling channel, and the second fin spirally extending along an extending direction of the lower cooling channel;

an electrostatic dielectric layer in contact with the substrate;

an adsorption electrode provided in the electrostatic dielectric layer and configured to generate an electrostatic force to support the substrate;

a chucking power source supplying power to the adsorption electrode;

a heater dielectric layer provided between the electrostatic dielectric layer and the upper cooling channel;

a heater electrode provided in the heater dielectric layer; and a heater power source supplying power to the heater electrode, wherein the upper cooling channel is separated from the lower cooling channel such that the first coolant is not mixed with the second coolant within the substrate support chuck, wherein a thickness of the center plate is greater than a thickness of the upper cover plate and greater than a thickness of the lower cover plate, in a vertical direction, wherein, when viewed in a cross section of the substrate support chuck, the upper cooling channel and the lower cooling channel are mirror-symmetric with respect to a plane horizontally traversing the center plate, wherein the plasma etching operation further comprises adjusting a temperature of the substrate support chuck by supplying the first coolant to the first inlet of the upper cooling channel and the second coolant to the second inlet of the lower cooling channel, and wherein, in the plasma etching operation, while the part of the material film is removed, the temperature of the substrate support chuck is adjusted between about −50° C. and about −100° C.

* * * * *